United States Patent [19]
Parker

[11] Patent Number: 5,355,013
[45] Date of Patent: Oct. 11, 1994

[54] INTEGRATED RADIATION PIXEL DETECTOR WITH PIN DIODE ARRAY

[75] Inventor: Sherwood I. Parker, Alameda County, Calif.

[73] Assignee: University of Hawaii, Honolulu, Hi.

[21] Appl. No.: 831,131

[22] Filed: Feb. 4, 1992

Related U.S. Application Data

[63] Continuation-in-part of Ser. No. 522,482, May 11, 1990, abandoned, which is a continuation of Ser. No. 198,357, May 25, 1988, abandoned.

[51] Int. Cl.$^5$ .................... H01L 29/78; H01L 31/06
[52] U.S. Cl. ............................ 257/458; 250/370.08; 250/370.09; 257/292
[58] Field of Search ............ 250/370.08, 370.09, 250/370.10, 370.14; 257/458, 292

[56] References Cited

U.S. PATENT DOCUMENTS

| | | | |
|---|---|---|---|
| 3,604,987 | 9/1971 | Assour | 257/458 X |
| 3,946,423 | 3/1976 | Augustine | 257/458 |
| 4,460,912 | 7/1984 | Takeshita et al. | 257/223 |
| 4,584,608 | 4/1986 | Soneda et al. | 257/292 X |
| 4,630,091 | 12/1986 | Kuroda et al. | 257/292 X |
| 4,736,234 | 4/1988 | Boulitrop et al. | 257/292 X |
| 5,140,162 | 8/1992 | Stettner | 250/370.09 |

*Primary Examiner*—Constantine Hannaher
*Assistant Examiner*—Edward J. Glick
*Attorney, Agent, or Firm*—Flehr, Hohbach, Test, Albritton & Herbert

[57] ABSTRACT

A particle detector has pixels arranged in rows and columns in a array-like formation and readout circuits for determining which of these pixels were hit by an ionizing particle. The pixels each including a PIN diode and charge transferring circuitry are integrated on a common silicon substrate with the readout circuits. Column buses and row buses are provided, associated with the pixels on the same column or row. A priority encoder gives the address of the highest numbered input that is asserted. Electric charge collected by a hit pixel is stored momentarily on a collection electrode and affects the current flow from the column bus to the row bus associated with the pixel. The column buses are sequentially activated and variations in the row currents are examined in parallel. To efficiently and accurately collect charge from the substrate, wells are used to which also contain the transferring circuitry and readout circuits. The wells also provide electrostatic shielding and prevent drain to source transistor punch-through. The PIN-diodes and the collection electrodes are arranged close to but not connected to the well.

12 Claims, 14 Drawing Sheets

INTEGRATED RADIATION PIXEL DETECTOR WITH PIN DIODE ARRAY

CROSS-REFERENCE TO RELATED APPLICATION

This is a continuation-in-part of prior application Ser. No. 07/522,482, filed on May 11, 1990, now abandoned, which is continuation of U.S. Ser. No. 07/198,357, filed May 25, 1988, now abandoned.

BACKGROUND OF THE INVENTION

This invention relates to radiation detectors in general, and more particularly to detectors having a two-dimensional array of PIN diodes integrated on a common silicon substrate together with circuitry to rapidly read out data from diodes in which impinging radiation generates charge.

The development of silicon microstrip radiation detectors as disclosed, for example, by J. Kemmer (Nucl. Instr. and Meth., 169 (1980) 499 and 226 (1984) 89), J. England, et al. (ibid. 185 (1981) 43), U. Kotz, et al. (ibid. A235 (1985) 481) and E. Heijne (CERN Report 83-06 (Jul. 21, 1983)) has improved the accuracy of electronic particle detectors by more than an order of magnitude. Until recently, associated readout electronics required channel-to-channel spacings two orders of magnitude larger than that of the strips to which they were attached. The low noise VLSI readout chip described by J. T. Walker, et al. (Nucl. Instr. and Meth., 226 (1984) 200), G. Anzivino, et al. (ibid. A243 (1986) 153), C. Adolphsen, et al. (ibid. A253 (1987) 444) and C. Adolphsen, et al. (IEEE Trans. on Nucl. Sci., 33 (1986) 57) has a channel pitch of 47.5 microns and provides amplification, integration, calibration and output signal multiplexing.

While the development of the low noise VLSI readout chip solved important space and cost problems, there still remain other important efficiency and accuracy problems inherent in the prior art. The use of microstrips provides for the information to be collected on and travel along a strip that is typically 8 cm long. Accordingly, there is no way of detecting where the charge initially attached to the strip, as all information as to the charge's original position in the direction of the strip is lost. Thus, information available in the ionization path is immediately degraded when using a microstrip collection structure, with the result that the detector does not provide accurate position information.

Another problem associated with the use of strips is their large capacitances and low resultant voltages. FIG. 1 illustrates a structure including one channel of a silicon microstrip radiation detector with its attached amplifier. In FIG. 1, Cx is about 1 Pf/cm, or about 10 Pf (due mostly to adjacent typically 10 cm length strips), the amplifier capacitance is about 2 Pf, and the feedback capacitance is about 0.1 pF, and the total effective capacitance is relatively large, namely about 10 pF+2 pF+350·0.1 pF$\approx$47 pF.

Since voltage is exactly equal to the charge divided by the capacitance, that is, $V=Q/C$, and a typical charge collected by a detector is, $Q=80$ eh/$\mu$m$\times 300$ $\mu$m$\times 1.6\times 10^{-19}$ coulombs, the resultant voltage is $V=82$ $\mu$V, e.g., $V=(24,000)\cdot(1.6\cdot 10^{-19})/(47\cdot 10^{-12})$. Therefore, because the voltage at the amplifier input is quite small, high gain, low noise amplifiers are required for a reasonably sized detector, where the strips are necessarily long. Furthermore, the dynamic input capacitance of the amplifier must be even larger to prevent the charge from remaining behind and inducing comparable voltage signals on adjacent strips.

Radiation damage is yet another problem associated with silicon detectors, which damage can result in increased diode leakage current. The initial diode current (as well as any increase therein) is generally proportional to the diode volume, and fluctuations in this current can cause noise. Such noise current fluctuations are greater for strip detectors because of their larger volume, than for pixel devices. Furthermore, a larger strip size results in larger capacitance, and for a given amount of signal charge Q, a smaller signal voltage $\Delta V$ results. The smaller signal voltage causes any radiation damage induced noise increase to become more of a problem. Thus, accuracy and efficiency in silicon microstrip structures tend to be more readily and easily degraded by radiation damage.

In prior art semiconductor detectors, a number of problems are associated with the attached electronics. Most detectors fabricate the control and readout electronics on a separate integrated circuit ("IC") chip, which usually results in higher capacitance. The detector IC chip itself must be made with easily depleted, high resistivity silicon. Thus, difficulties arise if the electronics is simply placed on the detector chip. For example, drain to source punch-through in field effect transistors ("FETe") can occur, which can cause large source to drain currents to flow regardless of the input signal voltage. The signal charge to be detected may drift into the bottom of the electronics rather than into the input gate of an amplifying first stage transistor, causing signals to be missed and thus undetected. Alteration of the signal collecting fields in the bulk of the detector due to switching transients in the electronics can occur, causing errors in the measured location of the radiation that generated the signal charge.

In summation, there is a need for a radiation detector that can efficiently and accurately generate position information as to radiation generated charged particles. Preferably such detector should provide a collection structure that permits the position of the collected charge to be accurately measured. To promote higher detection signal voltage, the detector collection structure should provide small capacitance, thus reducing the need for high gain, low noise amplification, and reducing system noise in general. Further, there is a need for a radiation detector that is free from ambiguity resulting from near simultaneous radiation hits.

The radiation detector should be radiation hardened, and have enhanced resistance to transistor punch-through, and should include detection and readout functions integrated on the same silicon substrate as the detector. Such detector should further provide an electrostatic shield between the readout electronics and the depleted substrate containing the signal charge collection field. There is a need for a radiation detector whose readout electronics circuitry can rapidly detect position information from pixels that have been hit by an impinging ionizing particle. Finally, such a detector should have a plurality of charge-generating and charge-collecting pixels, formed in a two-dimensional array of columns and rows.

The present invention provides such a radiation detector.

SUMMARY OF THE INVENTION

The present invention provides a monolithic device for detecting radiation in at least two dimensions. The devices includes a charge depletable substrate of high purity first conductivity type silicon having first and second surfaces, and a substrate thickness therebetween. A region of highly doped first conductivity type silicon is disposed adjacent the substrate second surface. A first plurality of spaced-apart collection electrodes of highly doped second conductivity type material are disposed adjacent the substrate first surface. Preferably these electrodes are disposed in an array defining at least first and second non-parallel axes.

Each collection electrode defines an electrode of an underlying diode that comprises the second conductivity type collection electrode, an underlying region of the substrate, and an underlying region of the highly doped first conductivity type silicon adjacent the substrate second surface.

The device further includes a voltage-biasable doped well region of first conductivity type material disposed on the substrate first surface. At least one collection electrode is disposed adjacent the well region.

Voltage differentials are coupled between the collection electrodes and the well region, and coupled between the collection electrodes and the region of highly doped first conductivity type material. These differentials substantially deplete adjacent substrate regions and produce an electric field that extends from the collection electrodes toward the well region, and that extends toward the region of highly doped first conductivity type material adjacent the substrate second surface.

In the presence of radiation, the substrate releases charges, which may be first or second polarity type. The electric field causes first polarity type charge to move to an overlying collection electrode for collection, and causes second polarity type charge to move to a well region or to the highly doped first conductivity type material adjacent the substrate second surface.

The device preferably further includes readout circuitry fabricated in the well region. The readout circuitry selectively collects charge present at a collection electrode and provides an electrical signal in response thereto to a peripheral region of the device. Preferably the readout circuitry includes a second plurality of metal-on-semiconductor ("MOS") signal transistors, each having a gate node coupleable to a collection electrode.

Each collection electrode may be identified by first-axis and second-axis co-ordinates. This permits determining from the co-ordinates associated with an electrode that collects charge, wherein the device the ionization that produced the charge was present.

The present invention reduces transistor drain-to-source punchthrough, provides an electrostatic shield for the readout transistors, and minimizes undesired current flow between the well and the region of highly doped first conductivity type material adjacent the substrate second surface. Further, this structure provides a detector whose collection structure has small capacitance, which results in a higher detection signal voltage, thus reducing the need for high gain, low noise amplifiers. Furthermore, the present invention reduces amplifier input capacitance while still providing a radiation detector that is free from ambiguity due to multiple track traversals. The present invention provides a radiation detector having radiation hardening characteristics, and having reduced system noise in general.

The pixels preferably are arranged in rows and columns that are associated with column buses and with row buses. When a pixel is struck or hit by radiation, charge is generated and is caused by an electric field to be collected by a collection electrode associated with the struck pixel. This collected charge can remain at the gate node of a signal transistor during a subsequent readout operation. During readout, the column buses may be sequentially energized, with row currents from each column being examined in parallel.

Each signal transistor gate associated with the energized column bus serves to control current flowing from that column bus to the associated row buses, according to the charge received from the associated pixel and stored thereon. Thus, row current variations due to struck pixels anywhere in each column may be quickly sensed.

Other features and advantages of the invention will appear from the following description in which the preferred embodiments have been set forth in detail, in conjunction with the accompanying drawings.

DETAILED DESCRIPTION OF THE INVENTION

Stated briefly, a radiation detector according to the present invention includes a diode for collecting charge generated by radiation incident thereon, charge transferring circuitry associated with the diode, and readout circuitry for providing data relating to such collected charge. A pixel usually includes at least the diode and the charge transferring circuitry. In the following example, the substrate is N-type, with P and N doped layers and regions thereon. However, one skilled in the art could of course reverse the conductivity of the regions without departing from the scope of the invention.

As described in detail below, each pixel has an address that provides the ability to pinpoint the location of the detected charge and the time of its detection. As such, a detector according to the present invention provides accurate charge position information.

Pixels according to the present invention are a few tens of microns square. Because of their size, these pixels have a much lower capacitance than is the case with microstrips according to the prior art. Therefore pixels in the present invention provide a much higher voltage per detected charge than do the strips of the prior art, typically 0.2 V for minimum ionizing particles. Accordingly, high gain, low noise amplifiers are not necessarily required for the present invention.

Furthermore, in the amplification of the signal transferred to the readout circuitry, the amplifier does not require a high input capacitance. This is because applicant's collection electrodes are small, and are separated from each other by a well that acts as a shield. This structure differs from prior art strip detectors, which have large strip-to-strip capacitances, and wherein charge remaining on the strips would cause interchannel signal coupling.

Figure 2:
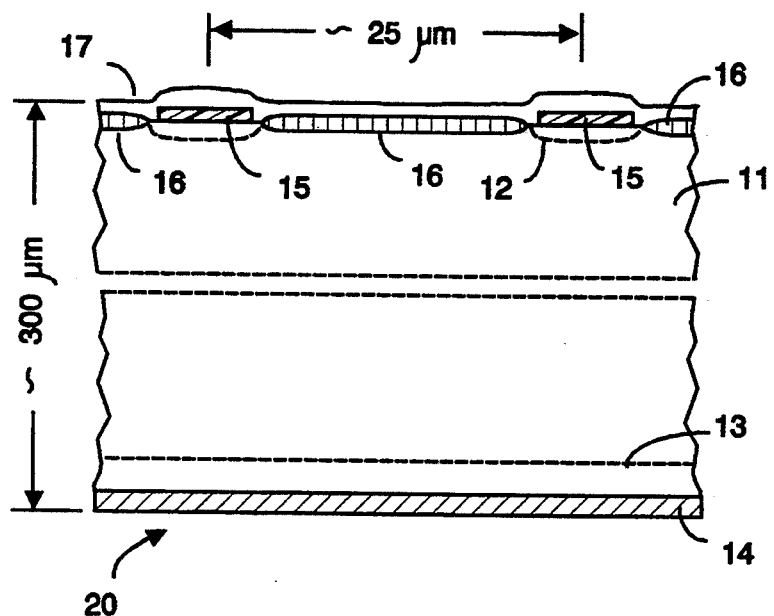
FIG. 2 depicts a cross section of a PIN diode, according to the prior art.

In a preferred embodiment, the diode is a modification of a standard PIN diode (P-type-Intrinsic-N-type), an example of which is shown in FIG. 2. In FIG. 2, substrate 11 is lightly doped (and hence nearly intrinsic) N-type bulk silicon, whose thickness is typically 300 $\mu$m. Heavily doped P and N layers 12 and 13 are formed on opposite surfaces of the substrate 11. An aluminum backside contact 14 is formed over the N+ layer 13, and aluminum contact electrodes 15 are formed over the P+ layer 12. As further shown in FIG. 2, the upperside of substrate 11 includes thermal oxide regions, e.g., and an overlying region of vapox, e.g. 17. The nearly intrinsic N region 11 can be depleted of mobile charge carriers with a modest voltage that will not cause breakdown. Because one side of the structure is P-type and the other side is N-type, voltage of the proper polarity can result in back biased diodes, having low leakage currents.

Figure 3:
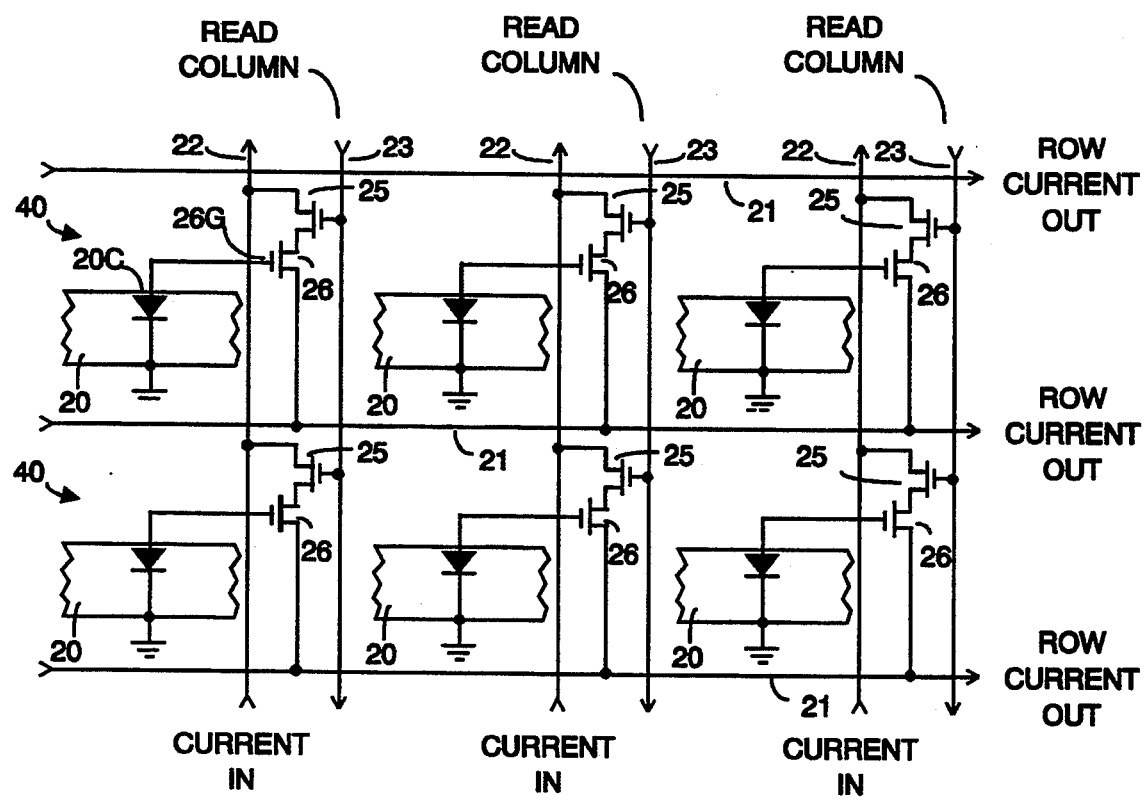
FIG. 3 is a schematic view of a two dimensional PIN diode array with a simplified partial schematic of the readout electronics, according to the present invention.

A pixel usually includes at least the PIN diode and charge transferring circuitry. A plurality of pixels is shown in FIG. 3, wherein each pixel has a collection electrode 20c, shown at the top of the diode 20. (For ease of reference, the individual diodes forming one of the pixels 40 will also be separately indicated by the reference numeral 20.)

The diode 20 portion of each pixel is set at a standard voltage, and deviation of the diode voltage from the standard voltage indicates a hit from a particle. As shown in FIG. 3, the pixels form a two-dimensional array, comprising rows and columns of diodes 20. It is understood that FIG. 3 is a simplified circuit diagram of the diode portion of a pixel, and is useful for explaining the basic operational principles of the present invention.

In FIG. 3, row buses 21 are individually associated with diodes 20 on the same row, and column and read buses 22, 23 are individually associated with diodes 20 on the same column. Thus, each column bus 22 not only crosses each row bus 21 near one of the diodes 20, but also connects with each row bus 21 through a read transistor 25 and a signal transistor 26, which are connected to each other in series.

A brief explanation of the detection method practiced utilizing the present invention will now be given. When the diode voltage deviates from the standard voltage, most of the charge that has been generated within a diode 20, and collected thereby, is transferred onto the gate 26g of the signal transistor 26 associated with this diode 20. During a readout phase, while the collected charge remains on the signal gate (e.g., the gate of the signal transistor 26), the read buses 23 are activated sequentially so as to make the read transistors 25 conductive.

The column buses, which are normally on, provide the currents from the activated column to all of the row buses 21, which are examined in parallel. Alternately, the read buses 23 could be left on and the column buses 22 could be activated sequentially.

Since these currents are controlled by the charge on the signal gates 26g, one can learn from the thus detected row current variations, the column position of a diode 20 that has been hit, for example, by an ionizing particle that has generated charge. Circuits providing the readout and control functions are contained in narrow strips along edges of the detector structure, and are not shown in FIG. 3.

The readout circuitry contains more elements than what has been above-described, and will be described in fuller detail below. The present invention provides that the readout circuitry be contained in a well 10, such shown in FIG. 4. In the present invention, well 10 provides multiple functions. For example, the well enhances the charge collection structure such that charges are directed to a collection electrode, and are guided away from the readout circuitry. The well provides an electrostatic shield for the readout circuit electronics. In addition, the well reduces or eliminates transistor drain-to-source punchthrough.

Figure 4:
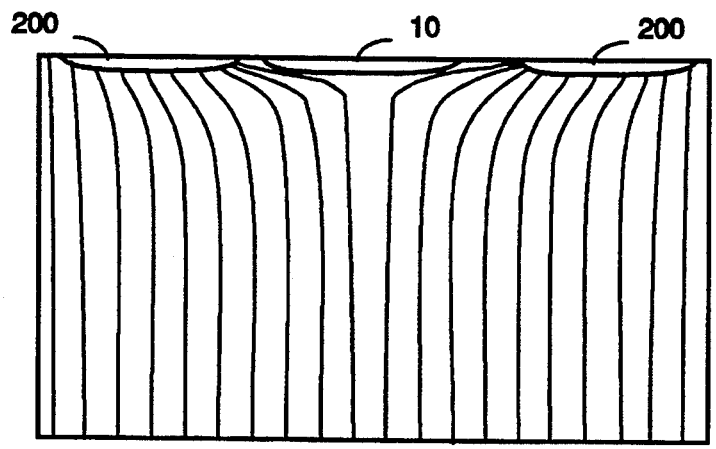
FIG. 4 depicts flow lines indicating the direction of the current in the silicon bulk, such flow lines being diverted by the well to the collection electrodes where the charge is collected, according to the present invention.

FIG. 4 illustrates the first of the well functions listed above. Because well 10 repels the charge, the charge is guided away from the well along field lines, and toward collection electrode 20c associated with diode 20. Therefore, each collection electrode has an area of the common substrate associated with it, enabling the detector to pinpoint the location of the charge with substantial accuracy.

Figure 5:
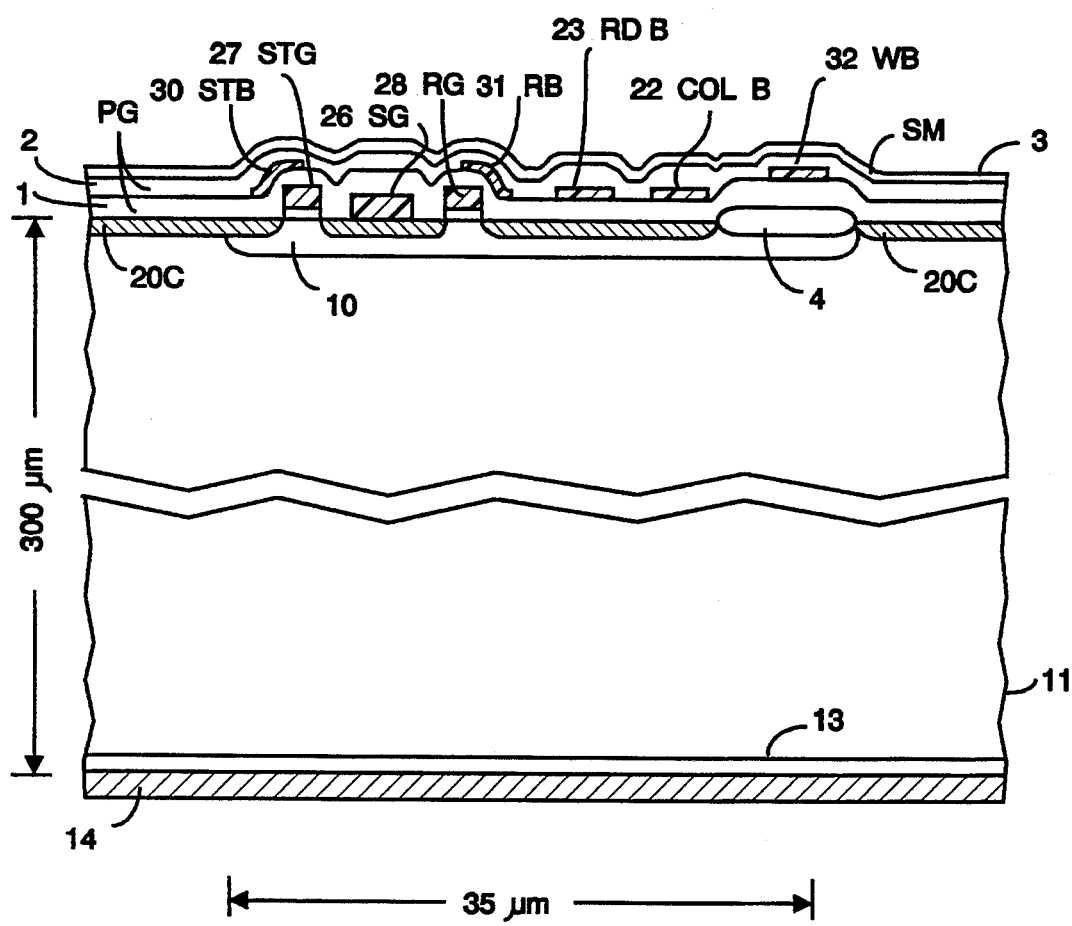
FIG. 5 is a cross section through the silicon bulk of one embodiment of a radiation detector for a pixel, according to the present invention.

Well 10 is of the same type of material as the substrate. A predetermined bias voltage is placed on the well 10, repelling the flow lines away from the readout circuitry in the well 10 and, guiding them toward the collection electrodes. The specific bias voltage on the well 10 depends upon design details, but typical values may be of the order of 5 V–10 V. As shown in FIG. 5, the N well underlies the region between the store bus 30 (StB) and the well bus 32 (WB). The flow lines in FIG. 4 illustrate how the bias voltage deflects the charges in the depleted substrate region (e.g., the ionization-sensitive region) to the collection electrodes, smoothly and symmetrically. Without well 10, much of the ionization charge would drift through the part of the substrate below the readout circuitry, and then into that circuitry, becoming lost for detection purposes.

Further, because well 10 is a good conductor coupled to a bus held at a definite voltage, well 10 acts as a Faraday cage. As much, well 10 shields the substrate from changing fields caused by voltage changes in the readout circuitry. These changing fields could alter the paths of charge drifting to the collection electrodes, thus affecting position accuracy. In addition, well 10 provides an optimally doped substrate for the transistors, preventing drain-source punchthrough.

FIG. 5 is a cross section of the silicon substrate of a radiation detector, for a pixel as shown in FIG. 3. In FIG. 5, detector layers 1 and 2 are phospho-silicate, layer 3 is a scratch mask layer of glass to protect against mechanical damage and impurities, and region 4 is an imbedded field oxide. Substrate 11 is N-type silicon that is almost intrinsic. The bottom 13 of substrate 11 is heavily N doped and covered by an aluminum back contact 14.

There are two regions on the upper surface of the substrate 11, namely collection electrodes 20c and well 10. PIN diode 20 usually consists of a P+material collection electrode 20c, a lightly doped near-intrinsic bulk 11, an N+ region 13, and a back metal contact 14. The PIN diodes 20 and collection electrodes 20c are close to but separate from the well 10, which contains part of the readout circuitry.

FIG. 4, as discussed, shows flow lines indicating the direction of the current in the silicon bulk. Such flow lines are diverted by the well to the collection electrodes where the radiation-induced charge is collected.

The sensitive region of the substrate is that part that is depleted and has electric field lines terminating on the collection electrodes. This region extends from just above diode junctions at the bottom of the collection electrodes down toward the bottom of the wafer (the extension normally but not necessarily being as far as the bottom N+ layer), and sideways under any adjacent N well to the adjacent collection electrodes. As a result, a continuous volume occupying substantially moat of the substrate is sensitive. The field lines must not intersect the conductive edges of the chip containing the present invention. For this reason, no collection electrodes are disposed near the borders of the chip, which border regions are preferably occupied by readout electronics. Methods for forming a well on a substrate are well known in the art, and will not be described in detail herein.

Figure 6A:
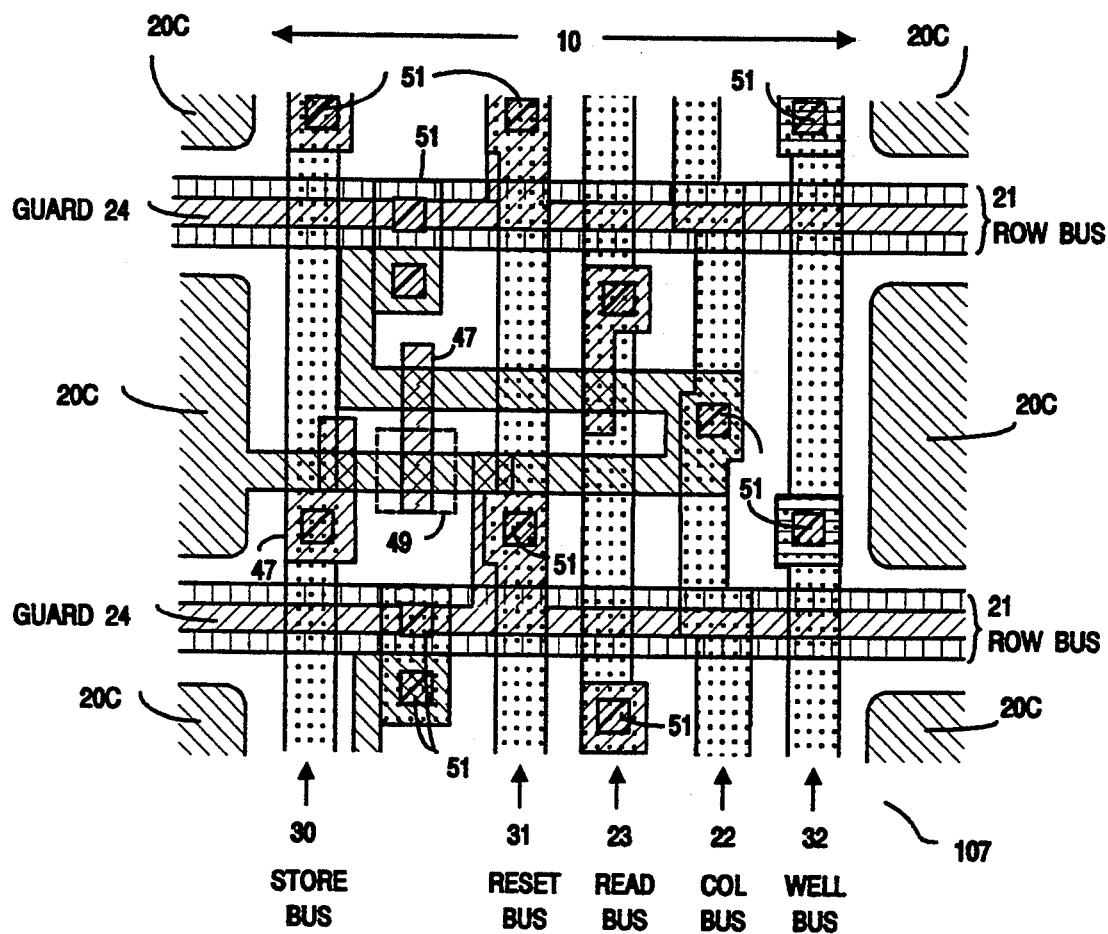
FIG. 6A is a top view of FIG. 5.

As shown in FIG. 6A, a top view of what is depicted in FIG. 5, the N well region 10 is preferably disposed beneath the various buses. The overlying buses include those fabricated at the metal 1 level, namely store Bus StB 30, Reset Bus 31, Read Bus 23, Column Bus 22, and Well Bus 32, and also include the othogonally fabricated buses at metal 2 level, namely Row Buses 21 and their associated optional polysilicon guard buses 24. FIG. 6A also depicts the P+ doped collector electrodes 20C associated with each underlying diode 20, as well as connective regions of polysilicon 47, associated poly-diffusion contact regions 49, and various contacts 51.

Figure 6B:
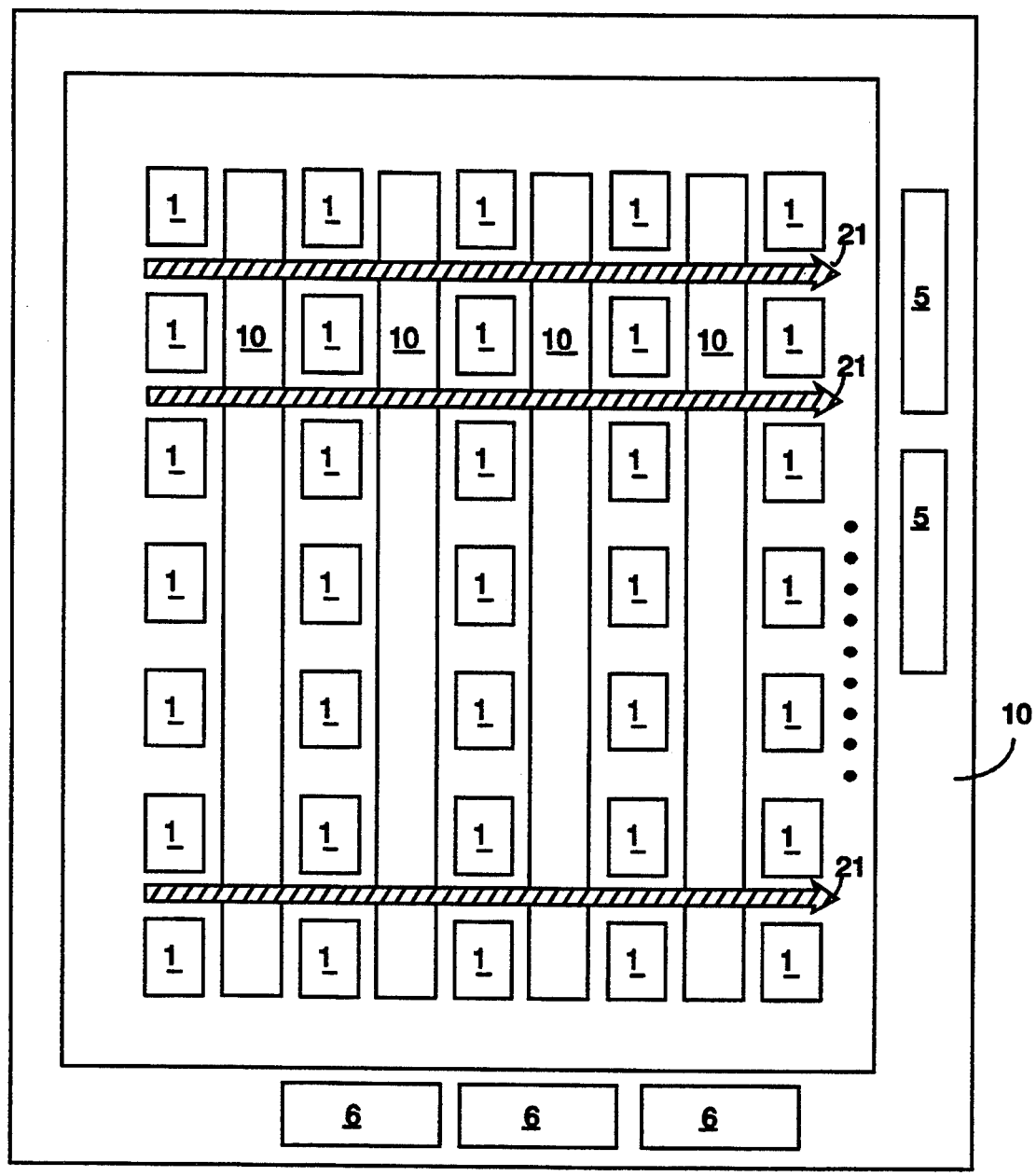
FIG. 6B depicts overall organization of a detector, according to the present invention.

FIG. 6B is a top view of the entire integrated circuit chip containing the present invention. The central portion of this figures shows one possible arrangement of wells 10, (one of which is shown in FIG. 6A), collection electrodes 1, and row buses, which run horizontally in the figure. This central portion is peripherally surrounded by a region that preferably contains readout circuitry 6 and reference networks 5.

Figure 7:
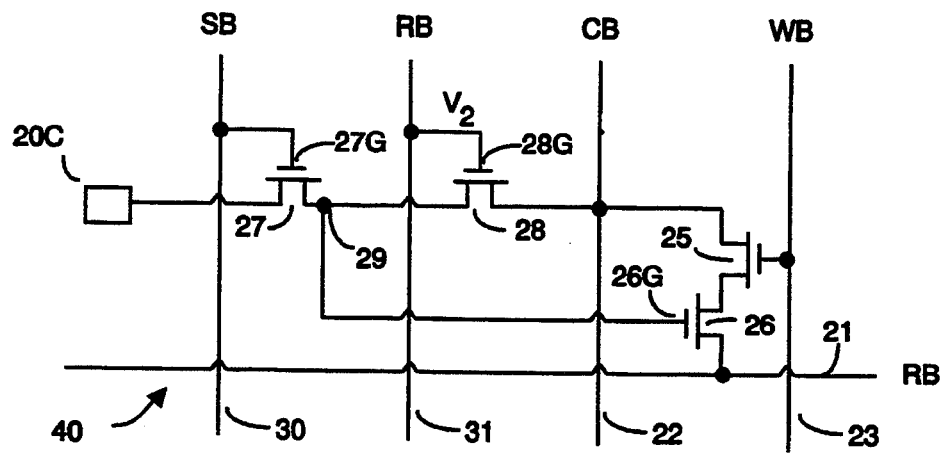
FIG. 7 illustrates in further detail the readout electronics of a pixel in the radiation detector, according to the present invention.

As shown in FIG. 7, in a detector according to the present invention each pixel 40 is associated with a collection electrode 20c that is further provided with a store transistor 27 and a reset transistor 28. Reset transistor 28 resets the associated diode 20 whose collection electrode is 20c to a standard voltage potential. Reset occurs both after a particle has been detected, and routinely so that there is no slow build-up of voltage on diode 20 while awaiting ionizing particle bombardment. The store transistor 27 connects the pixel diode 20 with a signal gate node 29 connected to the signal gate 26g of transistor 26. As such, store transistor 27 serves as a switching means therebetween, according to the voltage provided by store bus 30 to the gate 27g of store transistor 27.

Reset transistor 28 connects the signal gate node 29 with the column bus 22. As such, reset transistor 28 serves as a switching means therebetween, according to the voltage provided by reset bus 31 to gate 28g of the reset transistor 28.

There are two modes of operation for the collection and transfer of the charge from the collection electrode 20c of diode 20 to the signal gate 26g.

The first mode is referred to as a "charge sharing mode". In this mode, the store transistor 27 is turned on strongly, whereupon the collection electrode 20c and signal gate 26g are at nearly the same voltage potential. When charge is collected on the collection electrode 20c, its voltage rises slightly and a portion of this charge travels to gate 26g of signal transistor 26. The amount of charge on the collection electrode 20c, the channel of the store transistor 27, and on the signal gate 26g will be proportional to their respective capacitances. The pixel electronics is reset by setting column bus 22 to the desired voltage, and turning on the reset transistor 28 and the store transistor 27. The advantages of this charge sharing mode are that the collection operation is easy to control, and the store transistor 27 operates in a mode that is not sensitive to radiation damage.

Figure 8:
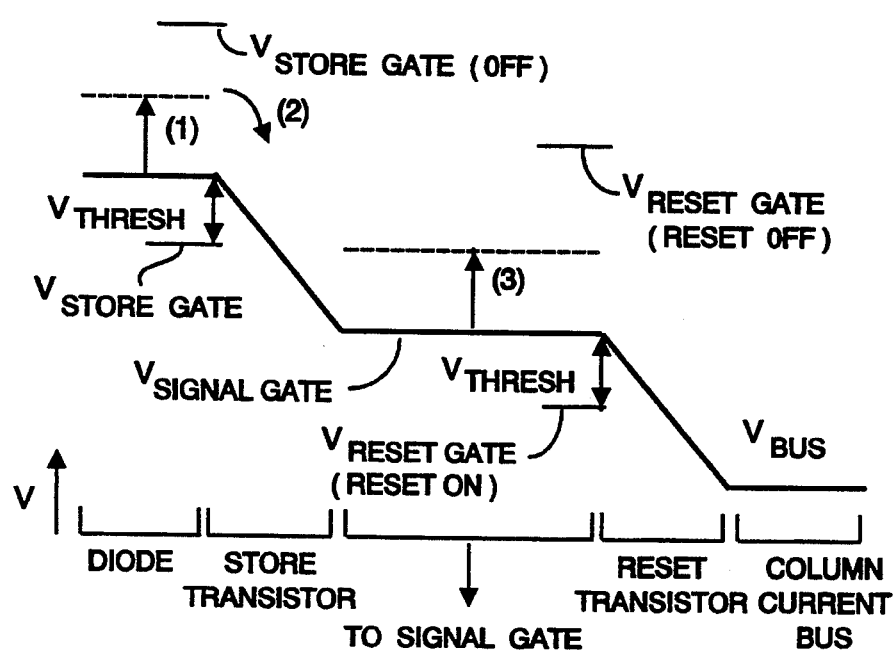
FIG. 8 depicts one special mode of readout (using the same readout circuitry), wherein almost all charge from a PIN diode is transferred to the signal gate, according to the present invention.

As shown by FIG. 8, in the second mode of charge collection, essentially all of the charge is transferred from the collection electrode 20c to the signal gate 26g by maintaining a voltage difference between the collection electrode 20c and signal gate 26g. To preserve this voltage difference, the store transistor 27 can only be weakly turned on. The advantage of the second mode is that the transfer of almost all the charge to the signal gate 26g establishes a larger signal. However, disadvantages are that the second mode collection operation is difficult to control, and the store transistor 27 operates in a mode that is sensitive to radiation damage.

In the first mode of operation, the pixel electronics is reset by setting column bus 22 to the desired voltage, and turning on the reset and store transistors, 28 and 27. As shown by FIG. 8, in the second mode of operation, gate voltages of store and reset transistors 27 and 28 are lowered from zero respectively to predetermined levels $V_1$ and $V_2$ (where $V_1 < V_2$). This allows current to flow from the column bus 22 through the reset transistor 28 until the voltage at the signal gate node 29 falls to $V_2-V_{th}$. Voltage $V_{th}$ is the gate-to-source threshold voltage, usually a little less than 1 volt for conduction in an enhancement-type transistor. Despite the large resistance of the transistors when the gates are near threshold potential, it takes only a few nanoseconds to stabilize the voltages because the capacitances being charged are small. At the end of the reset phase, the gate voltage of the reset transistor 28 is brought to zero volts. The reset phase is then followed by an input phase, during which a beam of ionizing particles is incident on the detector.

When the diode of a pixel collects a charge Q, the diode potential is momentarily increased by $Q/C_d$ where $C_d$ is the capacitance of the diode collecting the charge Q. Current immediately flows through the store transistor 27 to the signal gate 26g until the diode is restored to its original voltage at threshold. At this time, the total charge Q received by the diode 20 has been transferred to the signal gate 26g. This raises the voltage of the signal gate by $Q/C_{SG}$, where $C_{GS}$ is the signal gate capacitance. The bias $V_2-V_1$ across the store transistor 27 is selected to exceed potential $Q/C_{SG}$. After the charge Q is thus transferred to the signal gate 26g, the gate voltage of the store transistor 27 can be returned to zero, so as to protect the signal gate 26 from voltage shifts due to leakage current.

The input phase is followed by a readout phase, which has already been briefly described. Readout of the pixels 40 in any one selected column starts when the gates of the read transistors 25 in that column are pulsed on. Currents, whose magnitudes are controlled in part by the charge on the signal gates 26, flow from the column bus 22 corresponding to the selected column to all the row buses 21. At an edge portion of the detector where the row buses 21 terminate, a reference network is provided that simulates the currents and switching transients from zero-signal rows. The reference network (not illustrated) is of a design well established in this art.

Currents from the row buses 21 connected to the transistors in the selected column are compared in parallel with currents from the reference network. If the comparison indicates that at least one of the pixels 40 on this selected column has been hit, the magnitudes of the individual row currents are read out. (By "hit" it is meant that one of the pixels has been struck by an ionizing particle, and that radiation-induced charge was generated thereby, which charge has been collected.) The readout circuitry may include a priority encoder, such that only struck rows are read out, that is, rows on which are the pixels that have been hit. Thereafter, the read bus 23 associated with the next column to be selected is activated to continue the readout process.

Figure 9:
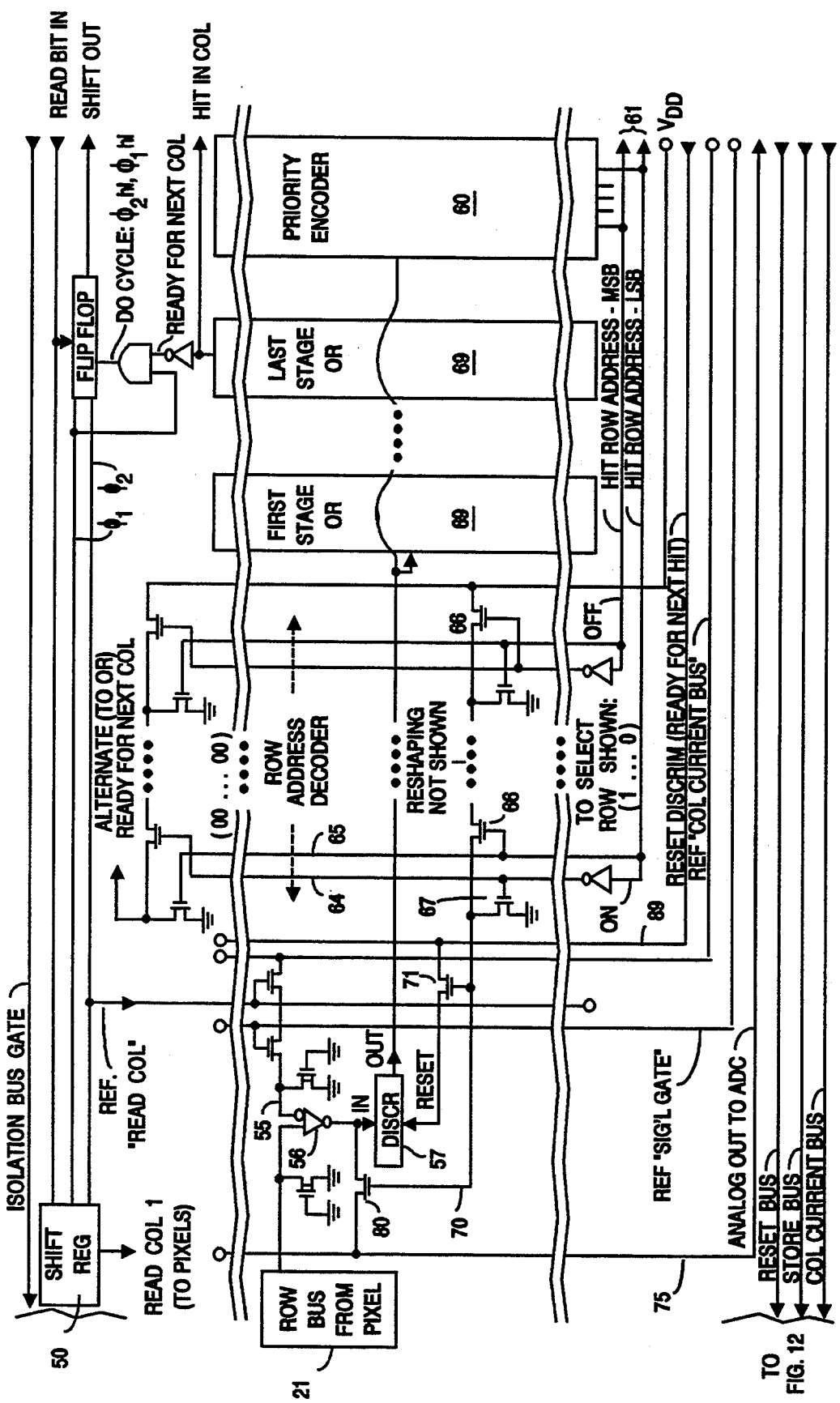
FIG. 9 is a schematic of chip edge located readout circuitry used to identify and generate a hit row address in a radiation detector, according to the present invention.

Turning now to FIG. 9, the readout circuitry will now be described. All reset buses 31 for all columns are normally pulsed together at the beginning of each cycle of operation, and are connected to a single metal bus (see bottom portion of FIG. 9). The store buses 30 may similarly be connected to another bus. As explained above, however, the read buses 23 are sequentially activated, column-by-column. This may be accomplished, for example, using a shift register 50. Such shift registers are known in the art, and can sequentially activate an arbitrary number of channels. In FIG. 9, $\phi_1$ and $\phi_2$ indicate pulse signals that are alternately produced from a flip-flop 51 for driving the clock lines of the shift register 50, in a manner known in the art.

In FIG. 9, numeral 55 indicates a line from the aforementioned reference network, through which are transmitted voltage levels and switching transients similar to those from the row buses 21 when no signal is present. A differential amplifier 56 is provided for each channel, corresponding to a row so as to subtract a reference voltage from the signal received from the row bus 21 for that row. The output from the differential amplifier 56 is received by a discriminator or comparator 57. Discriminator/comparator 57 remains in reset condition (and outputs a zero signal) if the received signal from the differential amplifier 56 is less than a threshold level. Typically, the signal from the corresponding diode 20 through the associated row bus 21 nearly matches the simulated zero signal from the reference network.

If the corresponding diode 20 was hit by an ionizing particle and a valid signal was received through the associated row bus 21, the output from the differential amplifier will be above the threshold level, and the discriminator 57 will be set and transmit an altered signal as a digital 1 rather than digital 0 pulse signal to the priority encoder 60.

Reading each column and each row of the diodes 20 is an easy, direct way to read the charge in the radiation detector. However, the readout speed would be slow. The purpose of priority encoder 60 in FIG. 9 is to generate a binary code giving the address of the nighest numbered input that is asserted. This indicates, one at a time, which row discriminators 57 are set, allowing them to be read out directly, skipping all the intermediate non-set discriminators.

The order of reading out the hit rows is not crucial so long as all the hit rows are only read once without missing any hit row. The priority encoder of the present invention is a combinational circuit having input lines labeled with code numbers of interrupt-requesting devices that can produce the code number of the highest priority device requesting an interrupt. With the priority encoder 60 shown in FIG. 9, the associated address generating devices are the plurality of discriminators 57, individually associated with each of the row buses 21.

Thus, when one of the read buses 23 corresponding to a specified column is activated (as explained above), the output from the priority encoder 60 will be the highest row address (highest priority) with a set row discriminator. If none of the diodes 20 in the specified column was hit, the discriminator outputs are all binary "0" and the encoder output is also zero (or 0 . . . 0 in binary). Conversely, if the encoder output is 0 . . . 0, it may be concluded that no signal charge was collected at any of the diodes 20 in this column.

An alternative method for detecting that no diode in any given column was hit uses an OR circuit 69, as illustrated in FIG. 9. While OR circuit 69 might be faster than the priority encoder, it is not essential for the present invention. No further time is spent on a column once OR circuit 69 outputs a signal, and a ready-for-next-column signal is output as shown in FIG. 9 so as to start a new cycle of readout regarding the next column. If the discriminator outputs are not all "0", the priority encoder 60 serves to output signals indicative of the row numbers of the pixels in the column that was hit.

Figure 1:
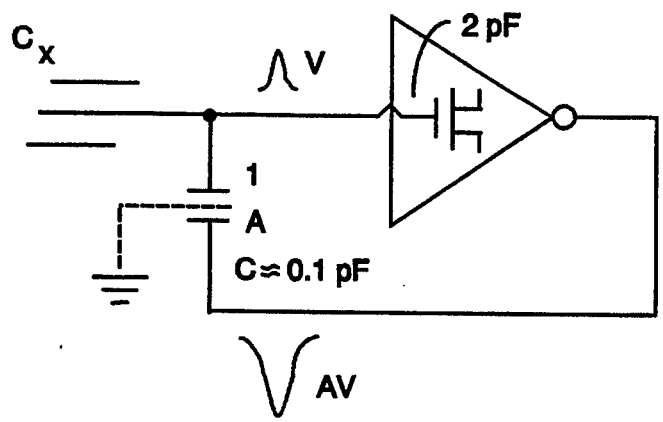
FIG. 1 depicts one channel of a silicon microstrip radiation detector with attached amplifier, according to the prior art.
Figure 10:
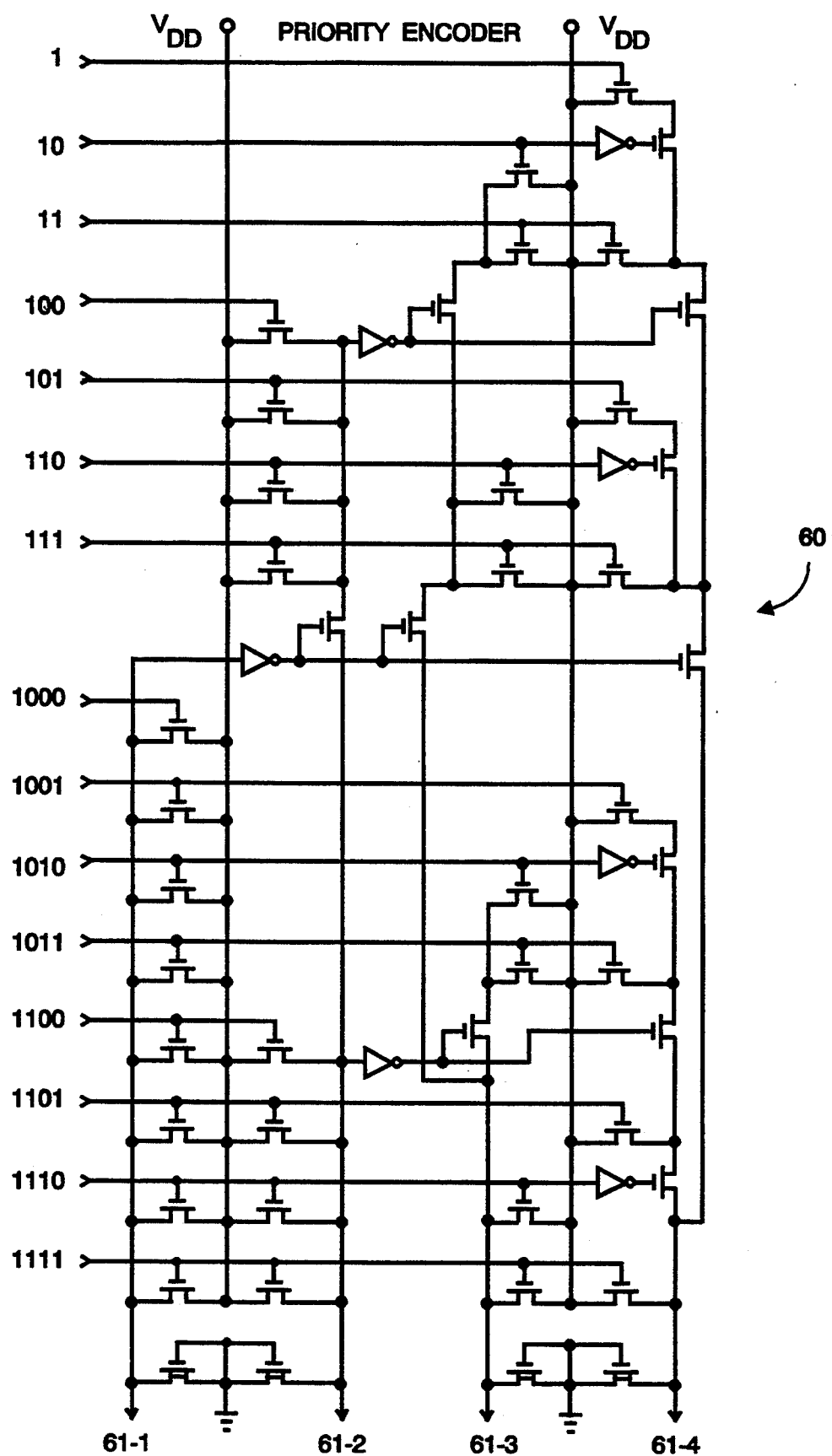
FIG. 10 is a simplified diagram depicting the priority encoder of FIG. 9 with sixteen input channels.

FIG. 10 depicts the basic design principles for priority decoder 60, according to the present invention. A 16-channel priority encoder is shown, with input lines labeled sequentially by code numbers "0001" to "1111", and with four output lines 61-1, 61-2, 61-3 and 61-4 for outputting the address of the highest channel inputting a "1" signal. In FIG. 10, 61-1 denotes the most significant bit MSB, and 61-4 denotes the least significant bit LSB.

A main priority decoder design feature is that the number of pass transistors that must be traversed by the output of the next channel to be read out grows only logarithmically with the number of input channels. This permits relatively rapid response during readout.

Each row input sets address columns corresponding to the "1" bits in its address. Each "1" bit also blocks "1" bits of lower addresses from advancing to the output to prevent, for instance, 0001 and 1000 from coming out 1001. If the "1" bits are required to pass through a series of pass transistors, one for each row whose address has "0" in the corresponding column, device speed would be impaired. Signals from low order addresses would be required to go through nearly n/2 pass transistors, each having a large series resistance that, when multiplied by the column capacitance, would cause a long RC response time.

With further reference to FIG. 10, the present invention blocks a signal one time, and not several times. In any vertical column, the group of "1's" blocks lower order bits just before the first "1" of the group. For example, the leading "1's" of 1000 through 1111 all set one line that blocks all bits from channels 111 and lower. The four "1's" in the second position in 1100, 1101, 1110, and 1111 block the two low order bits from 1001 to 1011 in one place, between 1011 and 1100. The bits from 111 and lower are not blocked, as they would have already been blocked by the leading "1."

At most, any given signal must traverse one pass transistor for its own column, and one transistor set by bits in each higher order column. Thus, the maximum number transistors any single signal must pass, the number of columns, will be the $\log_2$ (the number of channels). For more than about four columns, signal reshaping should be added between groups of pass transistors.

With the circuit thus structured as shown in FIG. 10, it can be easily seen, for example, that the line 61-1 will output "1" if and only if one or more of the eight highest input lines "1000" through "1111" carry a "1" signal. Extension to additional channels can be accomplished in a straightforward manner. The main feature of the design shown in FIG. 10 is that the number of transistors through which a new output must pass grows only logarithmically with the number of input channels (instead of growing linearly therewith). The priority encoder 60 of the present invention can be used to handle interrupt requests in a computer system in a more efficient fashion.

Referring back to FIG. 9, address information output from priority encoder 60 is directed to a computer (not shown) and also to a row address decoder 64. Each bit of the address of each row is provided with a vertical select bus 65, a pass transistor 66, and a grounding transistor 67. These transistors are arranged in a pattern corresponding to the address code number representing the row, such that its readout line 70 is activated only if the priority encoder 60 outputs its address code number. It is understood that in all other channels, at least one pass transistor is off, and the corresponding grounding transistors are on. When the readout line 70 is activated, transistors 71 and 80 are turned on. Transistor 80 allows the input analog signal to be output through an output bus 75 to an analog-to-digital converter (not shown). After the analog-to-digital output is read by the computer, a reset signal is sent through line 89 and then through transistor 71 to reset the discriminator 57, thus releasing the priority encoder for next hit row.

Even through the reset signal was sent to all row buses, only the row bus just read out is reset, because for all other row buses, at least one pass transistor 66 is not conducting and at least one grounding transistor 67 is conducting. If two or more pixels in the same column have been hit, the priority encoder 60 first outputs the row address of the hit pixel with the highest row address. After the discriminator 57 corresponding to this highest address is reset, the priority encoder 60 then outputs the second highest address and the analog signal corresponding to the second highest address is similarly output through the output bus 75.

The readout circuitry in FIG. 9 first generates address information for a hit pixel according to a predetermined order. Then a data processing device (not shown), such as a computer, reads the address information and pulse height information from the collected charge in the pixel associated with this address information. Even though the collected charge in the hit pixel is used to generate the address information, almost all of the collected charge is maintained at the signal gate 26g during the address information generating process. Thus, generation of the address information does not significantly deteriorate the accuracy of the collected charge.

The foregoing description of a preferred embodiment of the invention has been presented for purposes of illustration and description. It is not intended to be exhaustive or to limit the invention to the precise form disclosed, and many modifications and variations are possible in light of the above teaching. Some of these variations are described below.

The types of material, technology, and transistors to be used are not intended to limit the scope of the invention. If maximum signal is desired, the detector must be made with high resistivity (several thousand $\Omega$-cm), high purity silicon. This permits the diodes to be depleted through to the back side without requiring a large voltage that could cause dielectric breakdown. MOS transistors usually use a similar reverse-biased diode structure to provide isolation between the various circuit elements. However, MOS transistors are made with low resistivity (1–20 $\Omega$-cm) silicon to prevent the depletion regions from spanning the entire gap between drain and source regions. Moreover, very high quality, low leakage diodes must be made to permit the detection of minimum ionizing particles. Even when the fabrication starts with high resistivity silicon, there is a danger of introducing generation-recombination centers in the silicon bulk.

P-type MOS ("PMOS") devices are favored, as their fabrication is naturally compatible with present diode detector fabrication processes. These processes provide an N+ implant or diffusion into a polysilicon layer, to form the bottom layer of the diode and also to act as a getter to trap impurities during fabrication. The bulk of the wafer then must also be N type (to avoid forming junctions at the bottom layer). This requires the collection electrode, and the drain and source of the input transistor be P-type silicon, the well be N-type, and that the transistors be PMOS.

High purity P-type silicon is also available and, if a suitable gettering layer on the back side could be devised, usable N-type transistors may be fabricated. As noted, the device architecture places most of the readout electronics along the edges of the integrated circuit chip, for which larger wells are needed. P wells will be necessary to terminate field lines from the back side of the chip. This may permit the use of complementary MOS ("CMOS") for this portion of the electronics, without requiring a well within a well.

Further, readout circuits need not be operated during the data collection or input phase of operation, so as to cause all the charge Q collected by a diode 20 to be transferred to an associated signal gate. In the "charge sharing mode" of operation, the collected charge is shared between the diode 20 and the associated signal gate, according to their relative capacitances.

Finally, FIG. 9 is not intended to limit the layout of the readout and control circuitry. The probability of accidental overlap may be negligible in most applications, especially if a very large number of pixels are used. However, there may be applications wherein more than one event can be expected to occur before a readout trigger is generated. In such cases, it may be necessary to separate those hits that came in at the time of the triggering event, from those bite arriving at earlier and later times.

Figure 11:
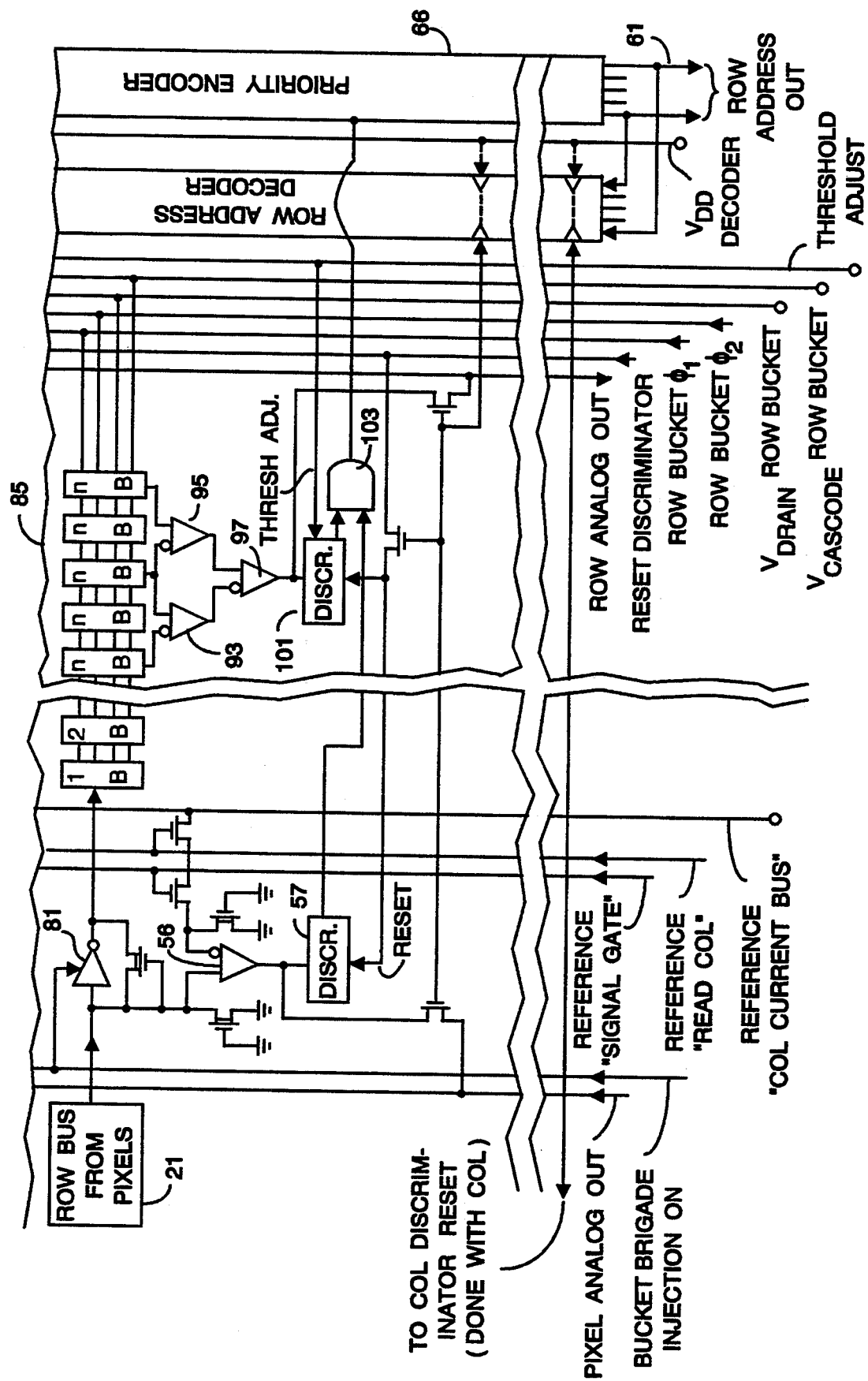
FIG. 11 is a schematic of chip edge located row readout circuitry, including time information, according to the present invention.

FIG. 11 depicts an alternative readout circuit adapted for such a situation, where like numerals are used for components that are similar to those described with reference to FIG. 9. In FIG. 11, all column read transistors (25, FIG. 7) are turned on during the data collection phase of the operation. The other pixel transistors operate normally such that current flows from the diode 20 through the store transistor 27 to the signal gate 26g, but current flow is now diverted constantly from the column buses 22 to the row buses 21.

The row current receiver in this case must have a sufficiently low input impedance such that the current variations from one column will not change the signal transistor operations of other columns. This may be accomplished with an invertor 81 that has a depletion transistor acting as a feedback resistor of value R. During the readout of individual pixels, invertor 81 is turned off, and the normal differential amplifier is used alone. The input impedance during data collection will be $R/(A+1)$, where A is the gain of the invertor 81. The output voltage will be RI, where I is the row current, which row current is then directed into a bucket brigade 85 of a type known to those skilled in the art.

Returning briefly to FIG. 7, column bus 22 provides a well defined voltage to node 29 during reset phase, and provides current during readout phase. Because column bus 22 is a low impedance bus, the transistors that divert current between column buses 22 and row buses 21 form constant current sources if there are no hits in the diode array. Under "no hits" condition, a constant current is shifted into bucket brigade 85 (see FIG. 11) under the control of a timing signal, such as a clock. If there are no hits, all the currents in each stage of the bucket brigade are substantially the same. Thus, for no hits, the differential amplifiers 93, 95 and 97 have zero signal outputs. However, if there is a hit in at least one pixel, the current in the corresponding row bus 21 will decrease, and the current in the corresponding column buses 22 will increase.

Referring again to FIG. 11, the decreased current is also shifted into the bucket brigade 85, which decreases the charge in each bucket. When this change reaches stage $n-1$, at a time $(n-2)$ times the individual cycle time later, the different signal levels at buckets $n-2$ and n will produce a non-zero output from differential amplifiers 93 and 97. Two stages later, different levels will activate gate 95 and produce an opposite response from amplifier 97. Either signal can be used. Steady changes in row currents caused by leakage currents in the pixel diodes 20 will cause equal changes from bucket to bucket and equal outputs from amplifiers 93 and 95, which will cancel at amplifier 97. The output from differential amplifiers 56 and 97 go to discriminators 57 and 101, which do not fire for low level noise. A coincidence between 56-57 (when the column next to the struck pixel is activated) and 97-101 (which identifies the hit time) will cause AND circuit 103 to fire and activate the priority encoder input that corresponds to that row.

Figure 12:
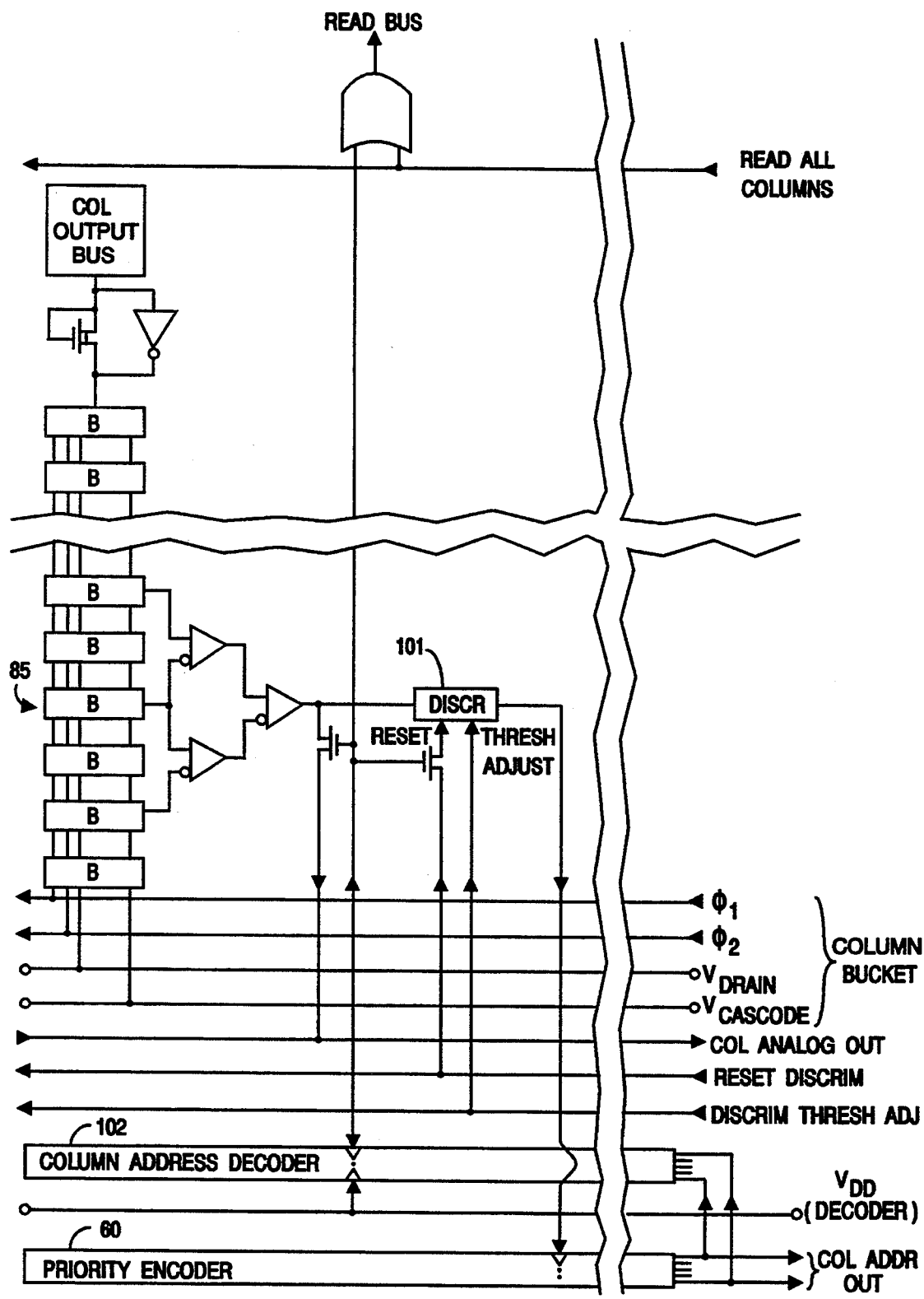
FIG. 12 is a schematic of chip edge located column readout circuitry used to identify and generate a hit column address, and to generate time information in a radiation detector, according to the present invention.

If additional ambiguity resolution is needed, it can be provided by a column bucket brigade circuit similar to that shown in FIG. 12, which is similar to FIG. 11 and uses equivalent components that are indicated by like reference numerals. As noted, a constant current source supplies each column bus 22. If there are hits in a column, the current flowing through the hit column will decrease because part of the current flows to the row bus 21, and the decreased column current is shifted into bucket brigade 85. By the same principle, if each stage bucket shifting takes time Tc, only the hit at $(n-1)$ times Tc prior to a read phase can trigger the priority encoder 60 and be read out. Thus, each column output from the readout circuitry in FIG. 12 carries time information.

Bucket brigade 85 serves to shift the received current as discrete charge packets, for example, sequentially from one capacitor to the next one. Alternatively, a switched capacitor array could be used in place of the bucket brigade 85. Column control as described above can be used after the bucket brigade 85 or switched capacitor array has completed its operation for readout. The encoder output goes to a decoder as well as to a control means (not shown) off the chip.

The readout circuitry of FIG. 12 has the additional function of controlling the readout of the analog signal, and resetting the discriminator 101 after both the address information from the priority encoder and the analog information have been accepted by the computer. This is done in a way similar to that used by the row circuit in FIG. 11. The column address goes not only to a computer but also to the column address decoder, 102. When bus Vdd is powered, the voltage is transmitted only to the column corresponding to that address. There, the voltage resets discriminator 101, and turns on pass transistor 103, connecting the analog signal with its output bus.

Radiation can damage silicon detectors in several ways, including: (1) radiation can creates centers in the depletion volume that inject leakage current. This leakage current can be collected by the charge collection electrodes, and can saturate the readout electronics. Fluctuations in that current produce noise that can mask a genuine signal. (2) Radiation can also create centers that can trap ionization charge before it is collected at the collection electrodes. (3) Radiation can create additional centers that are charged, and that can increase the depletion voltage, eventually to the point of breakdown. (4) Radiation can also produce charge that is trapped at the oxide/channel interface in transistors, which can cause voltage shifts in the electronics. Further, (5) radiation can produce other trapping sites at the oxide/channel interface in transistors, which cause increased electronic noise.

The radiation hardness of pixel detectors is inherently greater than that of strip detectors for several reasons. First, because the charge is collected on a small capacitance, a larger signal voltage is produced. Second, the smaller volume of depleted silicon per pixel results in a smaller leakage current per detecting element.

A larger signal decreases the importance of signal voltage shifts resulting from type (4) radiation damage, and decreases the importance of noise resulting from type (1) and type (5) radiation damage. Further, the reduced leakage current directly decreases the noise and saturation effects of type (1) radiation damage. In addition, the larger signal allows the possibility of using a thinner depletion volume which, while it will reduce the amount of signal charge that is generated and collected, will also decrease the effects of type (2) and type (3) radiation damage.

Two other general methods of increasing radiation hardness are available. Fabrication process steps may be altered to reduce radiation type (4) and type (5) damage in the electronics. In addition, circuit design techniques may be employed reduce these effects. However, no new fabrication steps are employed in the present invention.

Figure 13:
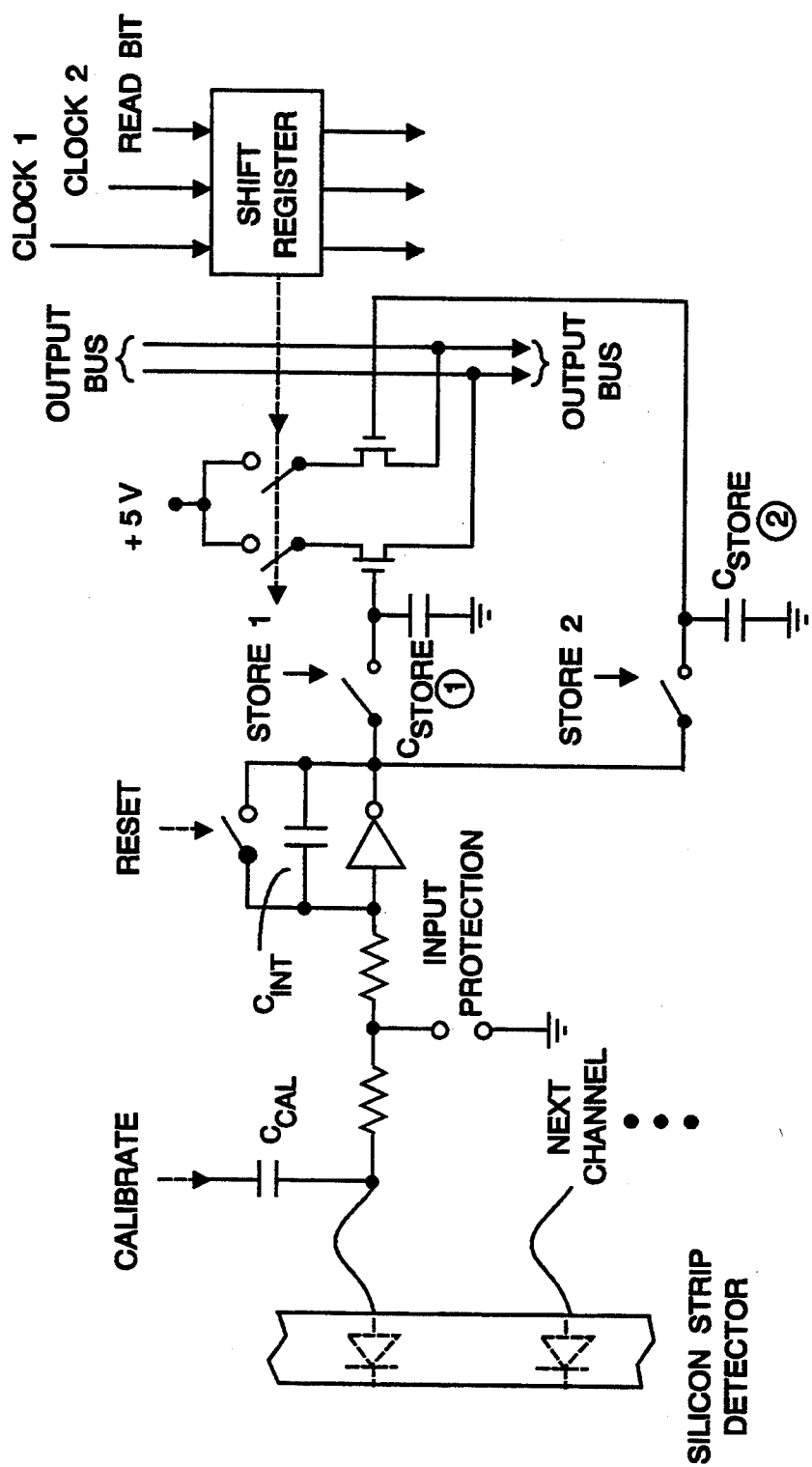
FIG. 13 is an example of a circuit design used for radiation damage analysis of FIGS. 14(A-I)
Figure 14A:
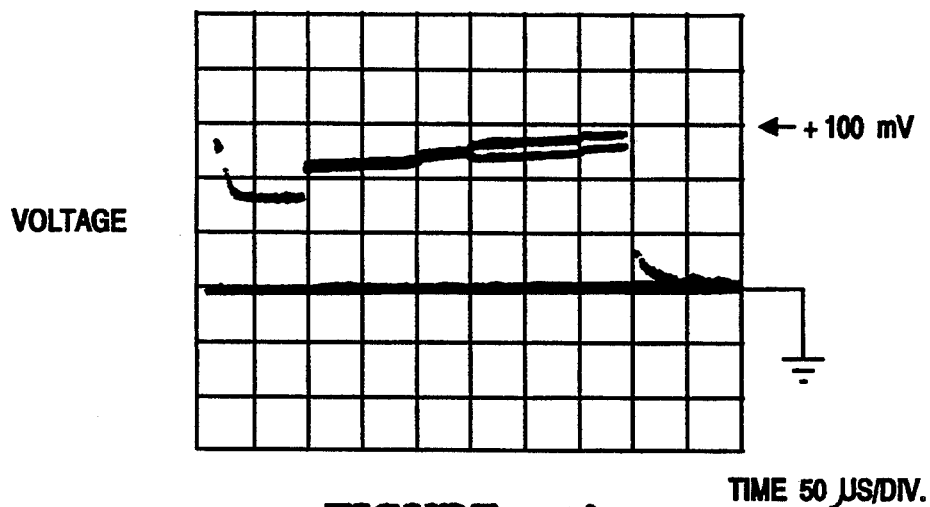
FIGS. 14(A-I) depicts data from a radiation-damaged chip, according to the present invention.
Figure 14B:
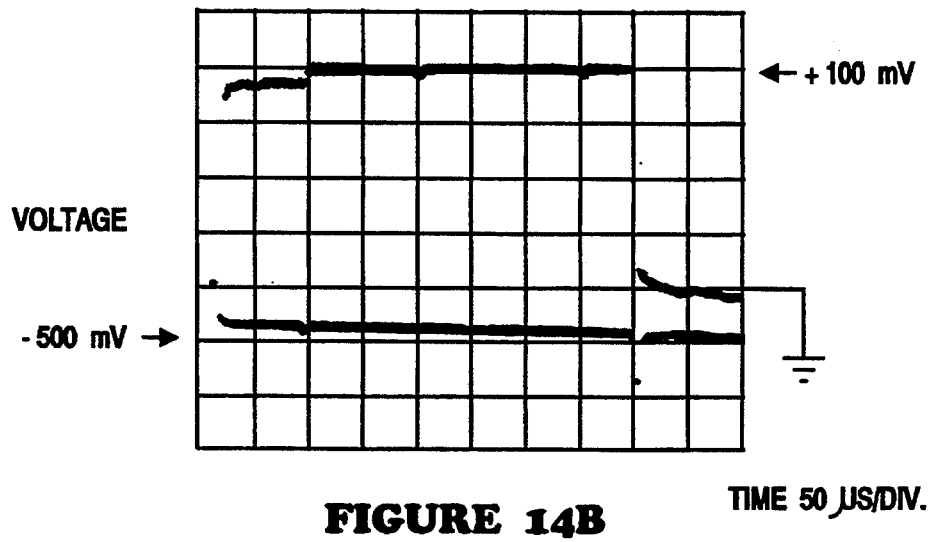
Figure 14C:
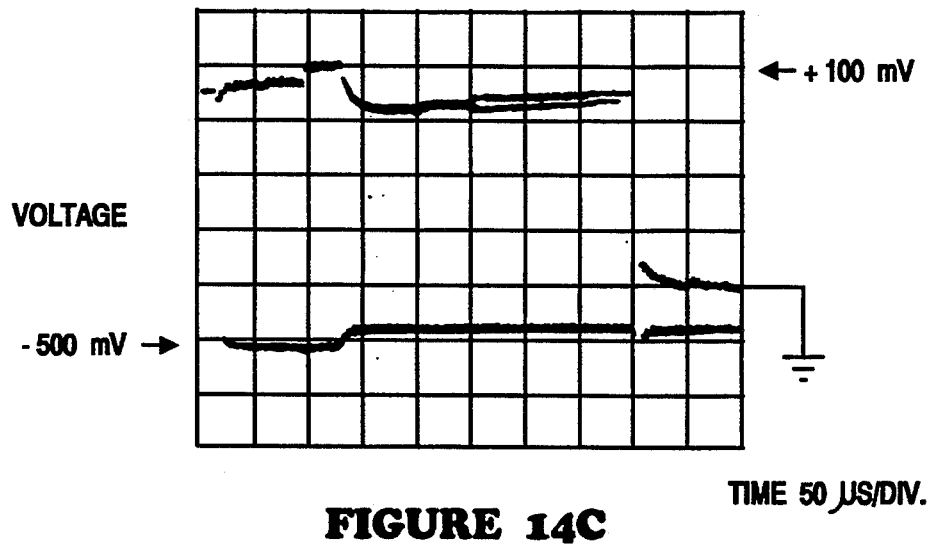
Figure 14D:
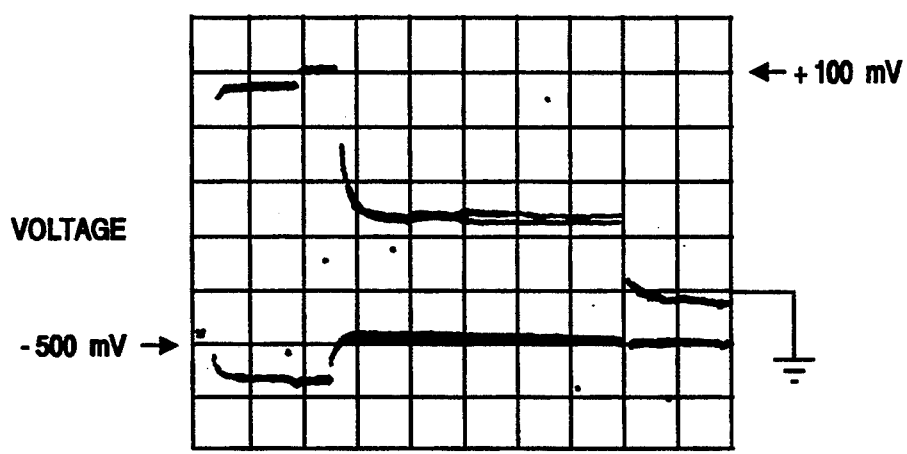
Figure 14:
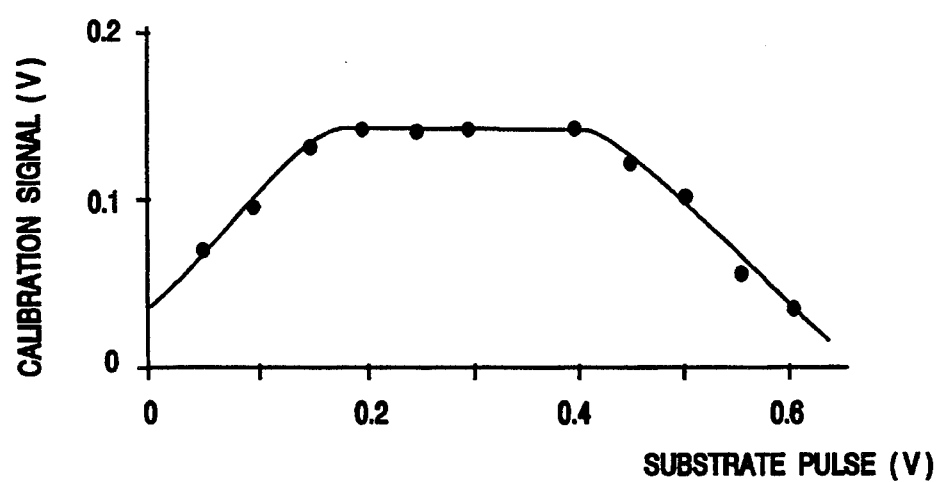
Figure 14F:
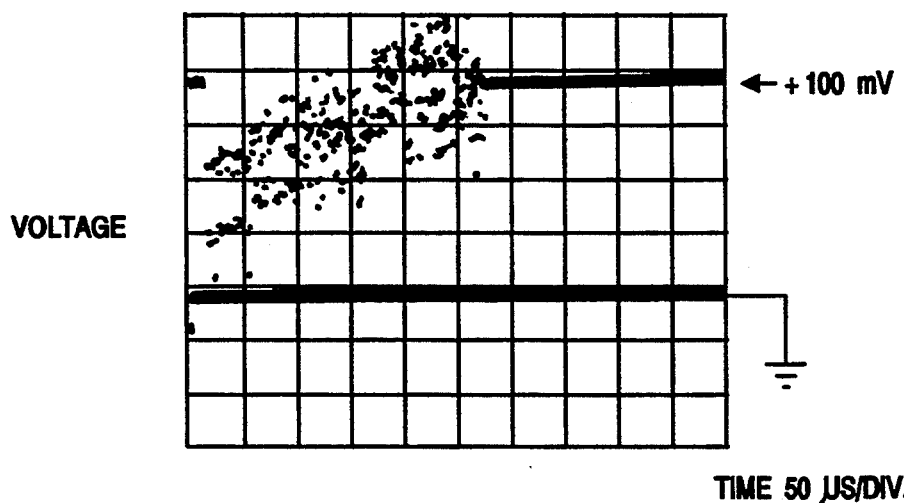
Figure 14G:
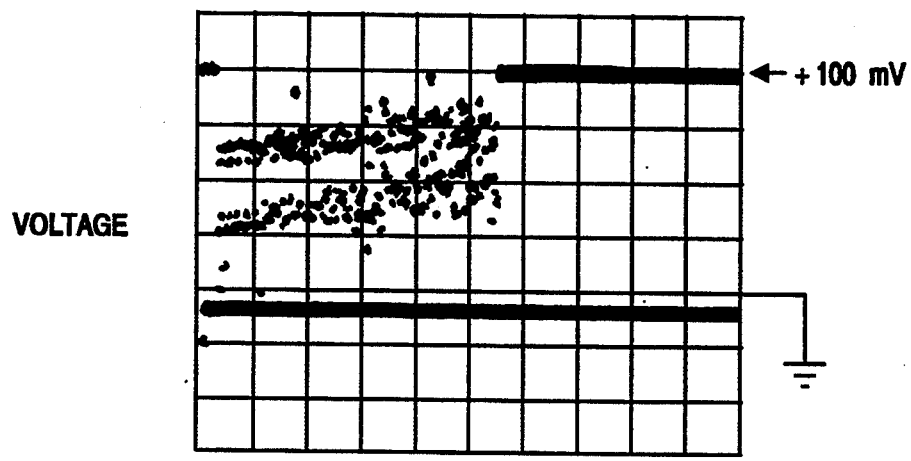

FIGS. 13 and 14 depict an example of radiation hardening characteristics with respect to the Microplex chip, described in U.S. Pat. No. 4,593,381 as a readout chip for use with prior art silicon strip detectors. FIGS. 14A–14D are traces depicting voltage at the output of the charge integrator of one of the 128 channels, wherein a low capacity (0.1 pF) 10:1 probe with a 1 $\mu$m tip was used. At about the middle of FIGS. 14A, 14C and 14D, the trace splits fork-like horizontally, where alternatively positive and negative calibration pulses were input. At the end of these traces, the baseline can be seen, where the power to the chip was turned off.

In FIG. 14A, an undamaged chip is shown, while FIG. 14B depicts the saturated pulse of a damaged chip that has received 17 krad from a cobalt source, 33% of which was received with operating power on to the chip. The lower trace shows the voltage level of the substrate. In FIGS. 14C and 14D, a pulse was fed to the substrate after the reset was turned off (at 2 cm on the 10 cm-wide horizontal calibration scale). This substrate-provided pulse couples into all the transistors on the chip, but with dominant effect to the input stage of the integrating amplifier, driving the output out of saturation, and restoring the calibration pulse. FIG. 14B shows the insensitivity of the output to the substrate pulse amplitude. Substrate-coupling a pulse as described above is somewhat unconventional, akin perhaps to making a conventional circuit that is not working, work again by coupling a pulse to the circuit's cabinet. Nonetheless, substrate-coupling a pulse may significantly increase the hardness of the Microplax chips.

Figure 14H:
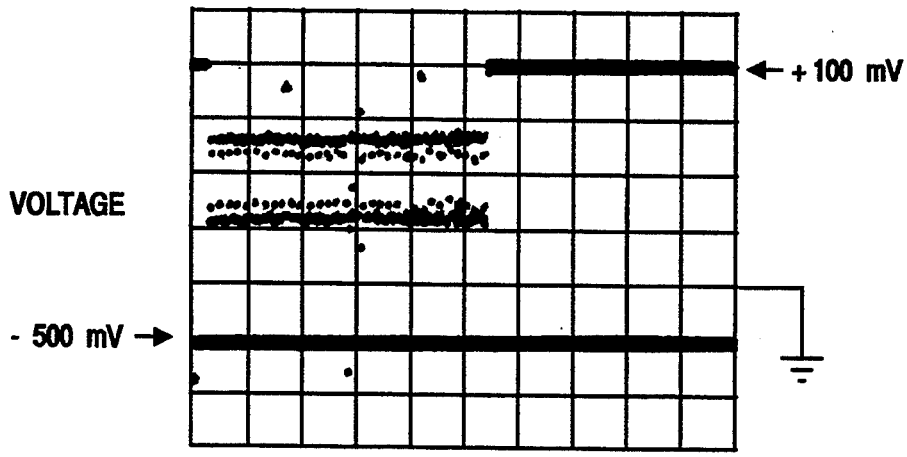
Figure 14I:
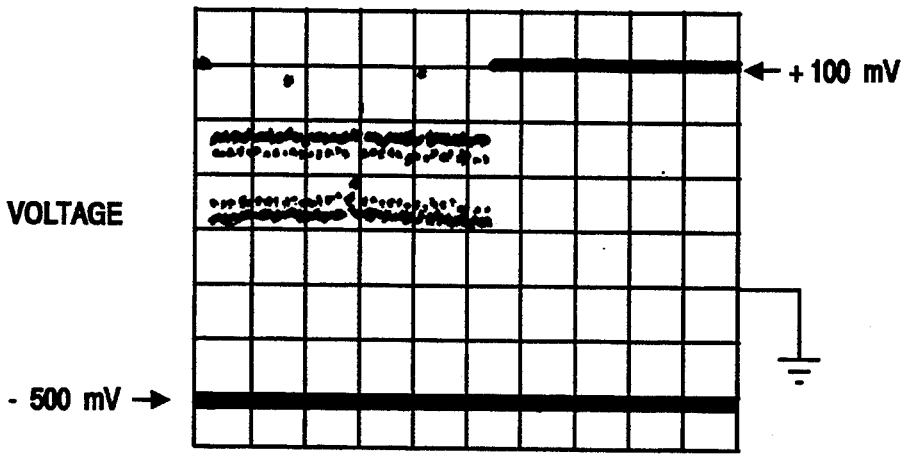

A more conventional use of substrate voltage is shown in the 128-channel multiplexed output traces of FIGS. 14F–14I. Even with saturation removed, charge stored on the 128 storage capacitors can leak off, as a radiation damage induced threshold shift causes the storage isolation transistor to turn on. This leakage causes the voltage shift of the last channels to be read out in FIGS. 14F and 14G. As the substrate voltage level, seen on the lower trace, is made more negative, the leakage stops. A comparison of FIGS. 14H and 14I shows that once this occurs, the output is insensitive to the exact value of this substrate voltage. In FIGS. 14F–I, the dot below the left end of the horizontal trace is the pulse of FIGS. 14C and 14D, now compressed by the slow sweep. The other dots represent faulty channels, in that imperfect Microplax chips were used for these destructive tests.

one additional feature of the circuit design of this chip can be used to increase the hardness of a pixel device against leakage due to threshold voltage shifts.

This feature is illustrated in FIG. 13, a more detailed diagram of the charge amplifier circuit shown in FIG. 1, and which is used in the Microplex circuit. Two storage capacitors and two storage isolation transistors are used, one being turned off before, and one after the data is stored, see G. Anzivino et al., Nucl. Instr. and Meth. A243 (1986) 153.

Since the leakage rates of the two transistors are almost identical, using the voltage on the two capacitors as the inputs to a differential amplifier connected to the output bus (see FIG. 13) results in the cancellation of the leakage shift. An indication of the independence of the signal magnitude from the leakage current can be seen in FIGS. 14F and 14G from the parallelism of the sets of points due to the positive and negative calibration signals.

The above-described circuit design techniques are taken from S. Parker, "A Proposed VLSI Pixel Device for Particle Detection" Nucl. Instr. and Meth. A275 (1989) 494. Rather than substrate-couple pulses as above described, for the pixel device described herein, the equivalent structure to pulse and bias is the well, which forms the immediate substrate below the electronics. An integrated pixel device that does not employ such wells would not be able to use this technique. However, this pulse would alter the collection field in the sensitive, depleted, volume and might prevent simultaneous input and output of data.)

All design goals for the present invention have been met. Specifically, the present invention provides a radiation detector that can efficiently and accurately collect radiation-generated charged particles. The present invention provides a detector whose collection structure allows the position of the collected charge to be accurately traced. Moreover, the present invention provides a detector whose collection structure has small capacitance, which results in a higher detection signal voltage than in the prior art. This, in turn, reduces or eliminates the need for high gain, low noise amplifiers. Furthermore, the present invention reduces amplifier input capacitance while still providing a radiation detector that is free from ambiguity due to multiple track traversals.

In addition, the present invention provides a radiation detector structure that reduces or eliminates transistor punchthrough, and that provides the transistors with an electrostatic shield. The present invention provides a detector wherein detection and readout functions are integrated on the same silicon substrate. Further, the present invention provides a radiation detector having a plurality of charge-generating and charge-collecting pixels arranged in columns and rows in a two-dimensional array. The present invention provides a radiation detector having radiation hardening characteristics, and having reduced system noise in general. Finally, the present invention provides a radiation detector with readout circuitry that can rapidly detect at least two-dimensional position information from pixels that have been hit by radiation.

Modifications and variations may be made to the disclosed embodiments without departing from the subject and spirit of the invention as defined by the following claims.

What is claimed is:

1. A monolithic device for detecting radiation in at least two dimensions, comprising:

a charge depletable substrate of high purity first conductivity type silicon having first and second surfaces, and a substrate thickness of at least 100 μm therebetween;

a region of highly doped first conductivity type silicon adjacent said second surface of said substrate;

a first plurality of spaced-apart collection electrodes of highly doped second conductivity type material disposed adjacent said first surface, said electrodes disposed in an array defining at least first and second non-parallel axes;

wherein each said collection electrode defines an electrode of an underlying diode that comprises said second conductivity type collection electrode, an underlying region of said substrate, and an underlying region of said high doped first conductivity type silicon adjacent said second surface of said substrate;

a voltage-biasable doped well region of first conductivity type material disposed on said first surface; wherein at least one of said collection electrodes is disposed adjacent said well region;

wherein voltage differentials coupled between said collection electrodes and said well region, and coupled between said collection electrodes and said region of highly doped first conductivity type material substantially deplete adjacent regions of said substrate and produce an electric field extending from said collection electrodes toward said well region and extending toward said region of highly doped first conductivity type material adjacent said second surface;

wherein in the presence of radiation, said substrate releases charges, charge of a first polarity being caused by said electric field to move to an overlying one of said plurality of collection electrodes for collection, charge of a second polarity type being caused by said electric field to move to said well region or to said highly doped first conductivity type material adjacent said second surface; and readout means including a second plurality of metal-on-semiconductor signal transistors, each having a gate node coupleable to one of said collection electrodes, fabricated in said well region, for selectively collecting charge present at said one collection electrode and providing an electrical signal in response thereto to a peripheral region of said device;

wherein a first-axis and second-axis co-ordinate corresponding to said one collection electrode collecting charge is determined.

2. The device of claim 1, wherein said first conductivity type is P-type, and said second conductivity type is N-type.

3. The device of claim 1, wherein said first conductivity type is N-type, and said second conductivity type is P-type.

4. The device of claim 1, wherein said radiation is selected from the group consisting of (a) incoming charged radiation directly producing primary ionization within said device, and (b) incoming neutral radiation that causes charged particles within said device to be released and to produce secondary ionization, which secondary ionization is detected by said device.

5. The device of claim 4, wherein said incoming neutral radiation is electromagnetic radiation.

6. The device of claim 1, wherein adjacent collection electrodes are separated by at least a region of said well region.

7. The device of claim 1, wherein said well region is implemented as a plurality of well regions.

8. The device of claim 1, further including:

a column bus, fabricated on said substrate, and a plurality of metal-on-semiconductor store transistors and reset transistors;

wherein at least one of said store transistors is series-coupled between one of said collection electrodes and a gate of a corresponding signal transistor, and wherein one of said reset transistors is series coupled between an output node of an associated store transistor and said column bus, said column bus being switchably coupled to carry electrical signals representing charges collected by said collection electrodes.

9. The device of claim 8, further including first mode means, fabricated on said substrate, for turning a store transistor on and an associated reset transistor off such that at least a fraction of charge collected at an associated collection electrode is coupled to an associated signal transistor.

10. The device of claim 8, further including second mode means, fabricated on said substrate, for setting gate nodes of an associated store and reset transistor to respective preset potential levels permitting current to flow from said column bus through said associated reset transistor until a potential at the gate node of said associated signal transistor changes to a threshold potential offset from the preset potential level at said gate of said associated reset transistor.

11. The device of claim 1, wherein said first plurality equals in number said second plurality.

12. The device of claim 1, wherein said first plurality does not equal in number said second plurality.

* * * * *